United States Patent
Rahul et al.

(10) Patent No.: US 12,190,994 B2
(45) Date of Patent: Jan. 7, 2025

(54) SINGLE PORT MEMORY WITH MULTIPLE MEMORY OPERATIONS PER CLOCK CYCLE

(71) Applicant: XILINX, INC., San Jose, CA (US)

(72) Inventors: Kumar Rahul, Hyderabad (IN); Santosh Yachareni, Hyderabad (IN); Mahendrakumar Gunasekaran, Coimbatore (IN); Mohammad Anees, St. Paul, MN (US)

(73) Assignee: XILINX, INC., San Jose, CA (US)

( * ) Notice: Subject to any disclaimer, the term of this patent is extended or adjusted under 35 U.S.C. 154(b) by 211 days.

(21) Appl. No.: 18/090,574

(22) Filed: Dec. 29, 2022

(65) Prior Publication Data

US 2024/0221808 A1 Jul. 4, 2024

(51) Int. Cl.
*G11C 7/22* (2006.01)
*G11C 7/10* (2006.01)

(52) U.S. Cl.
CPC ............ *G11C 7/222* (2013.01); *G11C 7/1069* (2013.01); *G11C 7/109* (2013.01)

(58) Field of Classification Search
None
See application file for complete search history.

(56) References Cited

U.S. PATENT DOCUMENTS

| 6,111,796 | A | * | 8/2000 | Chang | ........................ | G11C 7/06 365/207 |
| 11,348,624 | B1 | | 5/2022 | Walke et al. | | |
| 2001/0038565 | A1 | * | 11/2001 | Matsuzaki | ........... | G11C 11/4094 365/222 |
| 2002/0097623 | A1 | * | 7/2002 | Suzuki | .................... | G11C 7/227 365/210.1 |
| 2003/0095009 | A1 | * | 5/2003 | Gomm | ..................... | H03L 7/087 331/57 |
| 2004/0001364 | A1 | * | 1/2004 | Bhatia | .................... | G11C 7/222 365/194 |
| 2004/0174751 | A1 | * | 9/2004 | Edo | ......................... | G11C 7/22 365/193 |
| 2006/0062057 | A1 | * | 3/2006 | Blasi | .................... | G11C 7/1075 365/193 |
| 2006/0145741 | A1 | * | 7/2006 | Panpalia | ............... | H03L 7/0818 327/158 |
| 2007/0279111 | A1 | * | 12/2007 | Maeda | ............. | G11C 29/50012 327/158 |

* cited by examiner

*Primary Examiner* — J. H. Hur
(74) *Attorney, Agent, or Firm* — Patterson + Sheridan, LLP

(57) ABSTRACT

An integrated circuitry (IC) device for a memory device includes driver circuitry, selection circuitry, clock generation circuitry, and self-time path circuitry. The driver circuitry generates a plurality of driver circuitry outputs. The selection circuitry selects one of the plurality of driver circuitry outputs based on a plurality of enable signals. The clock generation circuitry receives the selected one of the plurality of driver circuitry outputs from the selection circuitry, and generates a clock signal based on at least the selected one of the plurality of driver circuitry outputs from the selection circuitry. The self-time path circuitry of a memory receives the clock signal and generates a reset signal based on the clock signal. The plurality of driver circuitry outputs and the clock signal are based on the reset signal, and the self-time path circuitry corresponds to one or more columns of a memory bank.

20 Claims, 6 Drawing Sheets

SINGLE PORT MEMORY WITH MULTIPLE MEMORY OPERATIONS PER CLOCK CYCLE

TECHNICAL FIELD

Examples of the present disclosure generally relate to read/write operations of a memory, and, more particularly, performing multiple read/write operations on a single port of memory in a single clock cycle.

BACKGROUND

Block Random Access Memory (BRAM) is typically used in an integrated circuit. For example, BRAM could be used for storing large amounts of data within integrated circuits such as a field-programmable gate array (FPGA) or a system on a chip (SoC), amongst others. BRAM may be used to accomplish tasks such as transferring data between multiple clock domains and transferring data between a target and host processor, among others.

BRAMs are typically configured in a single-port or dual-port configuration. A single-port configuration is used when there is a single interface that needs to retrieve data. In a single-port configuration, BRAM works based on a clock signal. Typically, BRAM will read out stored data based on a positive edge of a clock cycle. A single-port BRAM is able to perform a single read or write operation per clock cycle.

A BRAM in a dual-port configuration is able to read and write at the same time. A BRAM in dual-port configuration has an additional port for both reading and writing data. For example, based on the positive edge of the clock, port A can read the data stored on a first memory cell while port B can read the data stored on a second memory cell.

SUMMARY

In one examples, an integrated circuit (IC) device includes driver circuitry, selection circuitry, clock generation circuitry, and self-time path circuitry. The driver circuitry generates a plurality of driver circuitry outputs. The selection circuitry selects one of the plurality of driver circuitry outputs based on a plurality of enable signals. The clock generation circuitry receives the selected one of the plurality of driver circuitry outputs from the selection circuitry, and generates a clock signal based on at least the selected one of the plurality of driver circuitry outputs from the selection circuitry. The self-time path circuitry of a memory receives the clock signal and generates a reset signal based on the clock signal. The plurality of driver circuitry outputs and the clock signal are based on the reset signal, and the self-time path circuitry corresponds to one or more columns of a memory bank.

In one example, the memory circuitry device includes a block of memory, driver circuitry, selection circuitry, clock generation circuitry, and self-time path circuitry. The block of memory includes a memory bank coupled to sense driver circuitry. The driver circuitry generates a plurality of driver circuitry outputs. The selection circuitry selects one of the plurality of driver circuitry outputs based on a plurality of enable signals. The clock generation circuitry receives the selected one of the plurality of driver circuitry outputs from the selection circuitry, and generates a clock signal based on at least the selected one of the plurality of driver circuitry outputs from the selection circuitry. The self-time path circuitry of a memory receives the clock signal and generates a reset signal based on the clock signal. The plurality of driver circuitry outputs and the clock signal are based on the reset signal. The self-time path circuitry corresponds to one or more columns of the memory bank.

In one example a method for operating a memory circuitry includes generating, by a driver circuitry, a plurality of driver circuitry outputs. The method further includes selecting, by a selection circuitry in which one of the plurality of driver circuitry outputs based on a plurality of enable signals, and receiving, by a clock generation circuitry, the selected one of the plurality of driver circuitry outputs from the selection circuitry. Further, the method includes generating, by the clock generation circuitry, a clock signal based on at least the selected one of the plurality of driver circuitry outputs from the selection circuitry, and receiving, by a self-time path circuitry of a memory, the clock signal and generating a reset signal based on the clock signal. The plurality of driver circuitry outputs and the clock signal are based on the reset signal, and the self-time path circuitry corresponds to one or more columns of a memory bank.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
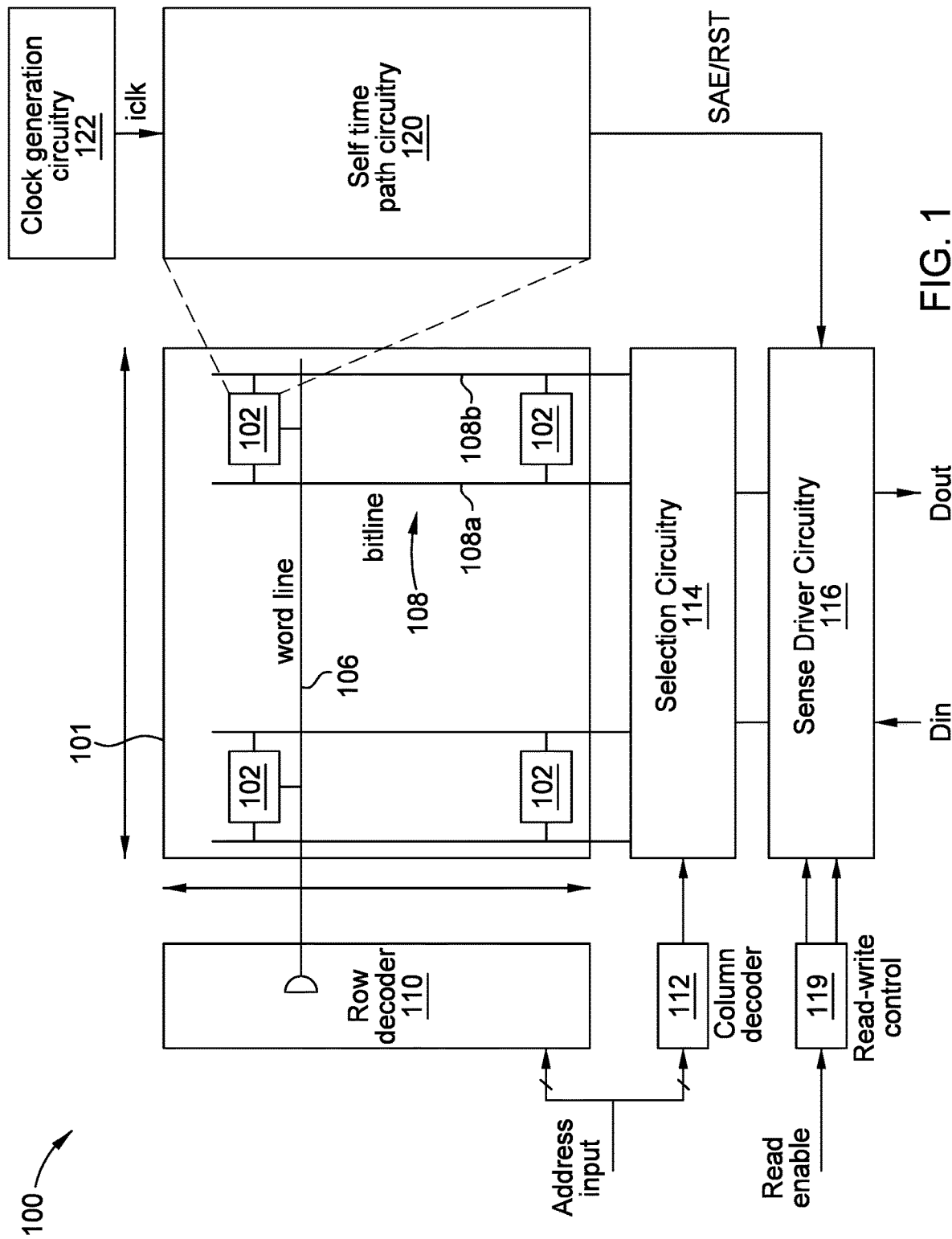
FIG. 1 is a schematic diagram of a memory circuitry, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

In one example, Block Random Access Memory (BRAM) is typically configured with one or more ports. A two-port BRAM is able to perform two read/write operations in a single clock cycle. On the other hand, a one-port BRAM is able to perform one read/write operation in a single clock cycle. A quad-port (four port) BRAM performs four read/write operations in a single clock signal. However, while implementing a quad-port BRAM is possible, such a memory is inefficient in terms of circuit size and usage and power consumption.

First, a quad-port BRAM requires the same data to be present in parallel ports. Accordingly, the writing of data is performed twice to two different memory locations. A read operation may be able to take place on each port, however, each port will essentially contain the same data.

Furthermore, implementation of a quad-port BRAM requires logic circuitry disposed outside of the BRAM. This may add an additional bottleneck of data processing, rendering the quad-port BRAM inefficient. Therefore, implementing quad-port BRAM requires an increased amount of circuit space, reduces efficiency, and increases power consumption.

In the following, a single port memory device that is able to perform more than more than one read/write operations per clock cycle is described. As is described in greater detail in the following, a clock signal is generated by a timing generation circuitry that is coupled to a self-time path circuitry corresponding to single port memory. The clock signal is provided by the clock generation circuitry to the self-timing path circuitry allowing for the single port memory to perform multiple read/write operations without having to include any additional ports. Thus, such a memory requires less chip space and power consumption as compared to other memory types, and maintains the efficiency of the memory.

FIG. 1 illustrates a memory device circuitry 100, according to one or more examples. In one example, the memory device circuitry 100 may be a BRAM, among other types of memory. The memory device circuitry 100 includes a memory bank 101 and memory cells 102 disposed within the memory bank 101. The memory device circuitry 100 further includes row decoder circuitry 110, column decoder circuitry 112, selection circuitry 114, sense driver circuitry 116, read-write controller 119, self-time path circuitry 120, and clock generation circuitry 122. The memory device circuitry 100 is disposed within one or more integrated circuit (IC). In one example, the memory device circuitry 100 is disposed within a first IC chip. In another example, the memory device circuitry 100 is disposed within two or more IC chips. In such an example, one or more of the row decoder circuitry 110, the column decoder circuitry 112, the selection circuitry 114, the sense driver circuitry 116, the read-write controller 119, the self-time path circuitry 120, and the clock generation circuitry 122 is on a different IC chip from another one or more the row decoder circuitry 110, the column decoder circuitry 112, the selection circuitry 114, the sense driver circuitry 116, the read-write controller 119, the self-time path circuitry 120, and the clock generation circuitry 122.

The memory cells 102 may be formed in rows and columns across the memory bank 101. Word lines 106 may be disposed across each row of memory cells 102. Each word line 106 may be coupled to a row of memory cells 102 and a row decoder circuitry 110. In operation, the row decoder circuitry 110 receives an address input indicating a specific memory cell 102 in the memory bank 101. Based on the address, the row decoder circuitry 110 selects a respective word line 106. The row decoder circuitry 110 drives the selected word line 106 to activate the selected word line 106.

Each column of memory cells 102 are also coupled to a respective pair of bit lines 108. For example, each column of memory cells 102 are coupled to a respective bit line 108a and a respective inverse bit line 108b. Each set of bit lines 108 are further coupled to a selection circuitry 114 which is further coupled to a column decoder circuitry 112. The column decoder circuitry 112 receives the same address input of a memory cell 102 as the row decoder circuitry 110. Based on the address, the column decoder circuitry 112 outputs a signal to the selection circuitry 114 indicating a set of bit lines 108 corresponding to the address input. The selection circuitry 114 selects the indicated set of bit lines 108. A bit line 108a and inverse bit line 108b of the selected set of bit lines 108 are activated. Once the word line 106 and set of bit lines 108, indicated by the address are activated, reading or writing operations (e.g., memory operations) may take place on the intersecting memory cell 102. Whether a reading or writing operation takes place is controlled by sense driver circuitry 116.

In one or more examples, the sense driver circuitry 116 comprise one or more of a voltage sense amplifier and a current sense amplifier. The sense driver circuitry 116 performs at least one memory operation (e.g., a read operation or a write operation) based on a reset signal (SAE/RST) provided by a self-time path circuitry 120 and a signal provided by a read-write controller 119. The self-time path circuitry 120 generates the reset signal based on a clock signal (iclk) provided by clock generation circuitry 122. In one example, a signal provided by the read-write controller 119 instructs the sense driver circuitry 116 to perform a read operation to read a voltage from the memory cells 102. In such an example, the sense driver circuitry 116 reads a difference in voltage between bit line 108a and inverse bit line 108b and generates an output signal Dout. In performing a write operation, the sense driver circuitry 116 is instructed by the read-write controller 119 to write a voltage onto the memory cells 102.

Figure 2A:
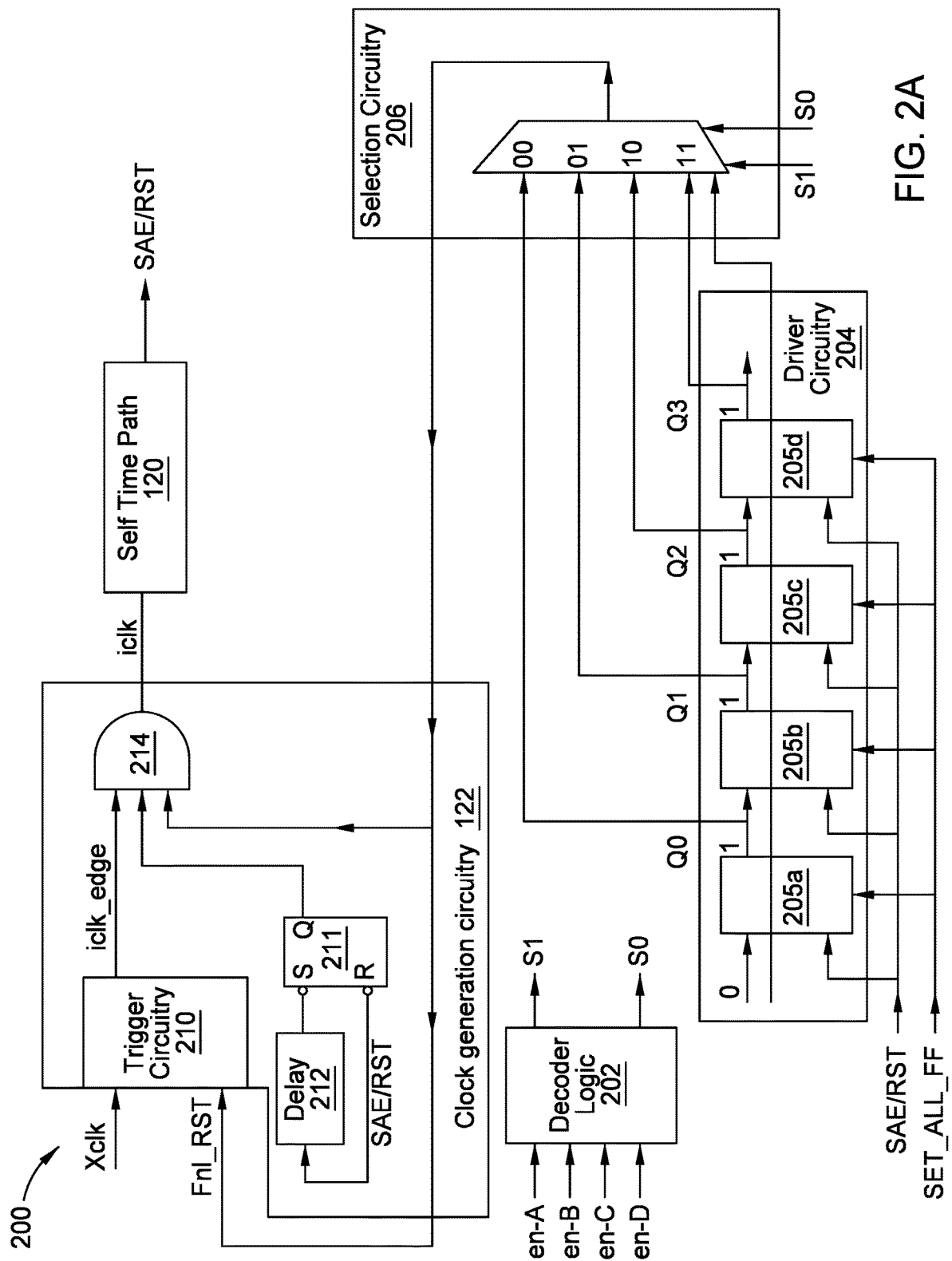
FIG. 2A is a schematic diagram of an integrated circuitry, according to an example.

FIG. 2A illustrates an IC device 200, according to one or more examples. The IC device 200 includes clock generation circuitry 122, self-time path circuitry 120, decoder logic circuitry 202, driver circuitry 204, and selection circuitry 206. The IC device 200 may be a portion of the memory device circuitry 100.

The decoder logic circuitry 202 receives a plurality of enable signals from a controller (not shown) and outputs a plurality of selection signals to the selection circuitry 206. The quantity of enable signals may be greater than, equal to, or less than the quantity of selection signals. In one example, the decoder logic circuitry 202 may be implemented as an M×N decoder. M may be greater than N. In other examples, M is equal to N. M has a value of one or more and N has a value of one or more. In one example, M is 4 and N is 2, and the decoder logic circuitry 202 is a 4:2 encoder. In other examples, the decoder logic circuitry 202 is implemented using different circuitry. In one or more examples, the decoder logic circuitry 202 receives four enable signals en-A, en-B, en-C, and en-D, and outputs two selection signals S0 and S1. Even though FIG. 2 illustrates a decoder logic circuitry 202 that receives four enable signals and outputs two selection signals, this is for example purposes only. The values of the selection signals determine how many read/write operations will be performed by the memory device circuitry 100.

The selection circuitry 206 receives a plurality of driver circuitry outputs generated by the driver circuitry 204 along with the selection signals S0 and S1. In one example, the selection circuitry 206 may be a T:V multiplexer (mux). T is greater than V. The value of T is one or more. The value of V is one or more. In one example, the value of T is 4 and the value of V is 1, accordingly, the mux is a 4×1 mux. In other examples, the selection circuitry 206 may be implemented using other circuitry.

The driver circuitry 204 may comprise a plurality of flip flops and/or other circuitry. The quantity of flip flops may be greater than or equal to the number of read/write operations the memory device circuitry 100 is configured to perform. In one example, the number of flip flops is one or more. Further, in one or more examples, the number of flip flops is four. In some examples, other quantities of flip flops may be used. In the example of FIG. 2A, the driver circuitry 204 comprises first flip flop 205a, second flip flop 205b, third flip flop 205c, and fourth flip flop 205d. Although the driver circuitry 204 of FIG. 2 includes four flip flops, this is for example purposes only. The driver circuitry 204 may include a quantity of flip flops greater than or less than four.

A plurality of driving circuit outputs may correspond to the output of each flip flop. Each of the flip flops may be connected in-series. First flip flop 205a may receive a data input from a controller (now shown) at a data input. From there, the output of each flip flop may be provided to the data input of the next in-series flip fop and the selection circuitry 206. For example, first flip flop 205a provides output Q0 to selection circuitry 206 and second flip flop 205b, second flip flop 205b provides an output Q1 to selection circuitry 206 and third flip flop 205c, third flip flop 205c provides output Q2 to selection circuitry 206 and fourth flip flop 205d, and fourth flip flop 205d provides an output Q3 to selection circuitry 206.

Each of the flip flops 205a-205d also receives a set signal Set_ALL_FF from set circuitry 250 (further described with regard to FIG. 2C) at a set input and SAE/RST from the self-time path circuitry 120 at a clock input.

The selection circuitry 206 receives the driver outputs and the selection signals. Based on the values of the selection signals S0 and S1, the selection circuitry 206 select ones of the driver outputs and provides the selected signal to the clock generation circuitry 122. The output of the selection circuitry 206 may be defined as the signal final reset Fnl_RST, and will be described in more detail below.

The clock generation circuitry 122 includes trigger circuitry 210, a set-reset (SR) flip-flop 211, delay circuitry 212, and logic gate circuitry 214. In one example, the trigger circuitry 210 receives an external clock signal Xck and Fnl_RST. In one or more examples, the trigger circuitry 210 additionally, or alternatively, receives enable signals and/or reset signals. The trigger circuitry 210 may generate a trigger signal iclk_edge based on the received inputs.

The SR flip flop 211 receives SAE/RST at a reset input (R) and a delayed SAE/RST signal SAE/RST_delay at a set input (S). The SAE/RST signal is delayed by the delay circuitry 212 to generate the delay signal SAE/RST_delay. The set input and the reset input may be inverted inputs as indicated by the bubbles at each input.

The SR flip flop 211 may provide an output signal Q to the logic gate circuitry 214 based on SAE/RST and SAE/RST_delay. The logic gate circuitry 214 may also receive Fnl_RST at an input. In one example, the logic gate circuitry 214 is implemented as an AND logic gate. In other examples, the logic gate circuitry 214 is implemented as other combinatorial logic that is able to generate the clock signal iclk based on iclk_edge, Fnl_RST, and Q.

The logic gate circuitry 214 outputs the clock signal iclk to the self-time path circuitry 118. As described above the self-time path circuitry 120 outputs SAE/RST to the sense driver circuitry 116. The SAE/RST is generated based on the clock signal iclk.

Figure 2B:
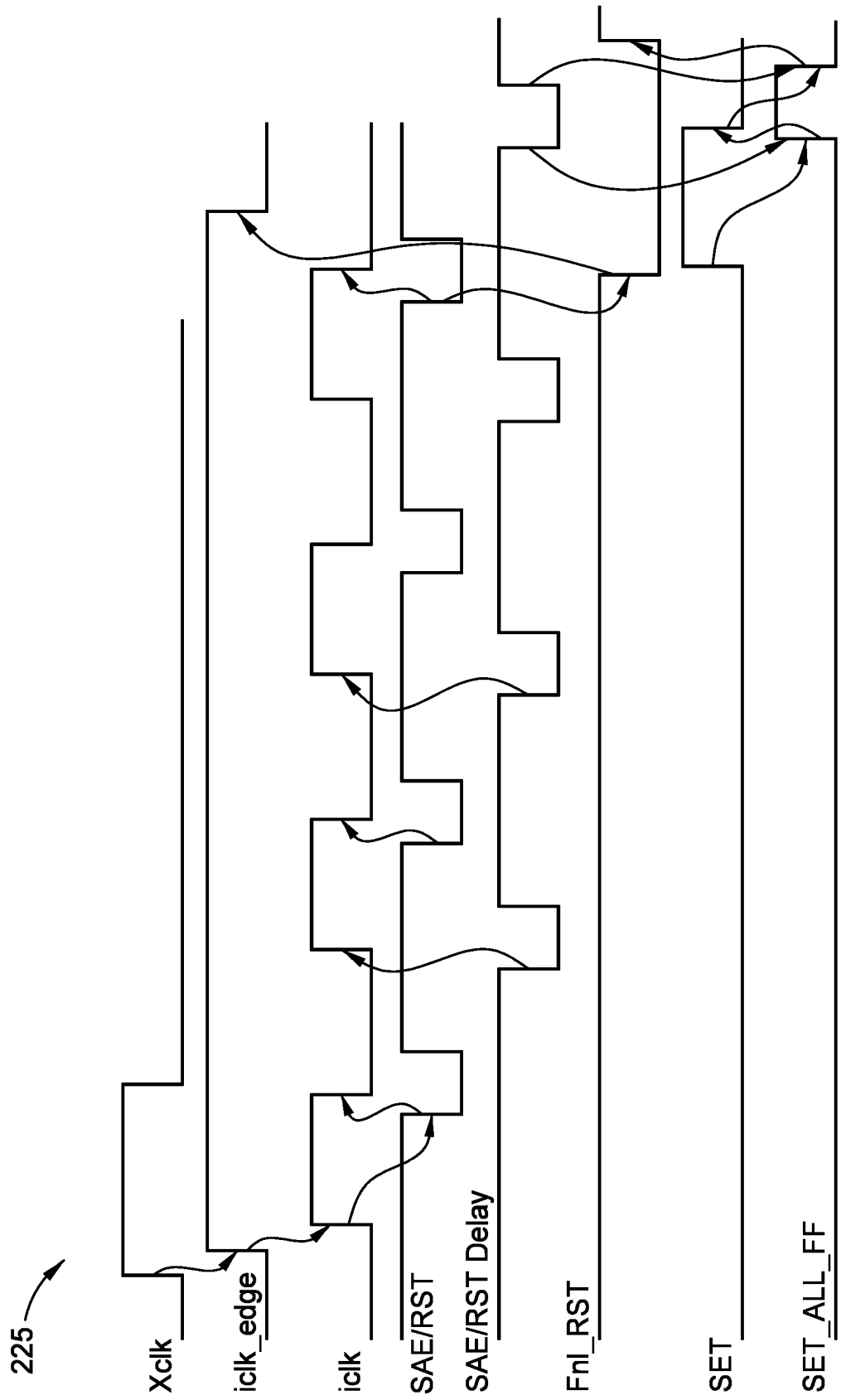
FIG. 2B is a timing diagram of the integrated circuitry, according to an example.

FIG. 2B illustrates a timing diagram 225 illustrating how the IC device 200 operates. As described above, the memory device circuitry 100 may be configured to perform a plurality of read/write operations. As an example, timing diagram 225 illustrates the signal waveforms for four read/write operations.

The signal iclk_edge is generated by the trigger circuitry 210, at least in part, based on a rising or falling edge of Xclk. In one example, Xclk is triggered by the enable signal enA-enD. Xclk is triggered if one the enable signals enA-enD are triggered. Additionally, or alternatively, iclk_edge may be generated by the trigger circuitry 210 based on a rising or falling edge of Fnl_RST. In one or more examples, the trigger circuitry 210 generates iclk_edge based on a rising or falling edge of Xclk and Fnl_RST. In one or more examples, the trigger circuitry 210 additionally, or alternatively, receives enable signals and/or reset signals. The enable signals initiate the trigger circuitry 210. The reset signals reset the trigger circuitry 210 to a predetermined (e.g., known) state. In one example, as illustrated in FIGS. 2A-2B, iclk_edge becomes logic level high when Xclk and/or Fnl_RST are logic level high.

In one or more examples, regardless of how many read/write operations are to be performed, each of the data inputs of flip flops 205a-205d are initialized to be equal to logic level high (or vice versa). Flip flops 205a-205d are reset (or initialized) based on SET_ALL_FF, which will be described in more detail below. Stated differently, after performing the desired quantity of read/write operations, SET_ALL_FF is pulsed, causing the output of each flip flop 205a-205d to be set to logic level high (or logic level low).

As explained above, the number or read/write operations are based on the enable signals en-A-en-D. The enable signals en-A-en-D are configured to cause the decoder logic circuitry 202 to generate select signals S0 and S1. The select signals S0 and S1 cause the selection circuitry 206 to select an output of the driver circuitry 204 based on the desired number or read/write operations to be performed. For example, if four read/write operations are to be performed the output of the fourth flip flop 205d is selected. In another example, if three read/write operations are to be performed the output of the third flip flop 205c is selected. In the example illustrated in FIGS. 2A-2B, S0 and S1 are both logic level high. Accordingly, the selection circuitry 206 selects the output Q3 of the fourth flip flop 205d.

As described above, each of the flop flops 205a-205d, begin at the same logic level, such as logic level high via SET_ALL_FF. Therefore, Fnl_RST begins at logic level high. Because the sense driver circuitry 116 is reset after each read/write operation, the self-timing path circuitry 120 initializes SAE/RST to a logic level such as logic level high. On the other hand, the flip flops 205a-205d, Fnl_RST, and SAE/RST may be initialized at logic level low.

Additionally, Xclk may be initialized at logic level low. Then to initiate the read/write operations Xclk is transitioned to logic level high causing the trigger circuitry 210 to output iclk_edge at logic level high. Alternatively, Xclk may be initialized at logic level high and may trigger the trigger circuitry 210 by transitioning to logic level low. Because SAE/RST and SAE/RST_delay are logic level high, Q is logic level high. Additionally, as described above, Fnl_RST is logic level high. Therefore, the logic gate circuitry 214 may output iclk at logic level high. Based on ick being logic level high, the self-time path circuitry 120 generates a first SAE/RST pulse, causing the sense driver circuitry 116 to perform a first read/write operation. During the first SAE/RST pulse, when SAE/RST is switched to logic level low, the inverted input received at the reset input of SR flip flop 211 is logic level low (inverted to high) and causes Q to reset, which in turn forces the logic gate circuitry 214 to output iclk as logic level low. This creates a first iclk pulse. Then via delay circuitry 212, SAE/RST_delay after SAE/RST pulses. When SAE/RST_delay pulses and reaches logic level low, the inverted input received at the set input is inverted logic level high, which forces the SR flip flop 211 to switch Q back to logic level high, initiating a second iclk pulse. Accordingly, the frequency of iclk is based on the delay circuitry 212.

As is illustrated in FIG. 2A, the flip flops are serially connected. For example, the output of the flip flop 205a is connected to the input of the flip flop 205b. The output of the flip flop 205b is connected to the input of the flip flop 205c. Further, the output of the flip flop 205c is connected to the input of the flip flop 205d. The input of the flip flop 205a is connected to the output of a driver external to the driver circuitry 204. At each falling or rising edge of the SAE/RST, each flip flop 205 receives and outputs a new value. For example, a logic level low input is provided to the first flip flop 205a. In one or more examples, as each flip flop 205a-205d receives an inverted SAE/RST signal at a clock input, when SAE/RST is pulsed, each flip flop 205a-205d outputs the corresponding received input. Thus, after iclk is pulsed, Q0 becomes logic level low while Q1-Q3 remain at logic level high. Therefore, Fnl_RST remains at logic level high. As will be described in more detail below, SET_ALL_FF remains at logic level high during the first iclk pulse.

In one or more examples, as Fnl_RST, Q, and _iclk edge are at logic level high, iclk becomes logic level high. In the same manner described above, iclk becoming logic level high causes a second SAE/RST pulse. The self-time path circuitry 120 receives the second iclk pulse and generates a second SAE/RST pulse for a second read/write operation. The second SAE/RST pulse causes each flip flop 205a-205d to output its input, therefore, Q0-Q1 are logic level low and Q2-Q3 are logic level high. Therefore, Fnl_RST remains high, and generates a third iclk pulse. The self-time path circuitry 120 receives the third iclk pulse and generates a third SAE/RST pulse for a third read/write operation. In the same manner described above, a third SAE/RST pulse causes each flip flop 205a-205d to output the corresponding input. Q0-Q2 are logic level low while Q3 remains logic level high, and Fnl_RST remains at logic level high. Therefore, Fnl_RST remains high, and thus, allows for a fourth iclk pulse. The self-time path circuitry 120 receives the fourth iclk pulse and generates a fourth SAE/RST pulse for a fourth read/write operation.

In the same manner described above, a fourth SAE/RST pulse causes each flip flop 205a-205d to output its input and Q0-Q3 are each now logic level low. As Q3 is logic level low, Fnl_RST transitions to logic level low. Fnl_RST being logic level low causes iclk_edge, and in turn, iclk to switch to logic level low. Accordingly, the self-time path circuitry 120 halts pulsing SAE/RST. The memory device circuitry 100 does perform any additional read/write operations during that clock cycle (e.g., cycle of the clock signal Xclk). Also as will be discussed in more detail below, Q0-Q3 being at logic level low causes SET_ALL_FF to pulse, resetting outputs of Q0-Q3 to logic level high, and allowing for another cycle of read/write operations.

In one or more examples, the operation of integrated circuitry 200 may use a logic level low where logic level high is described, and a logic level high where a logic level low is described.

Figure 2C:
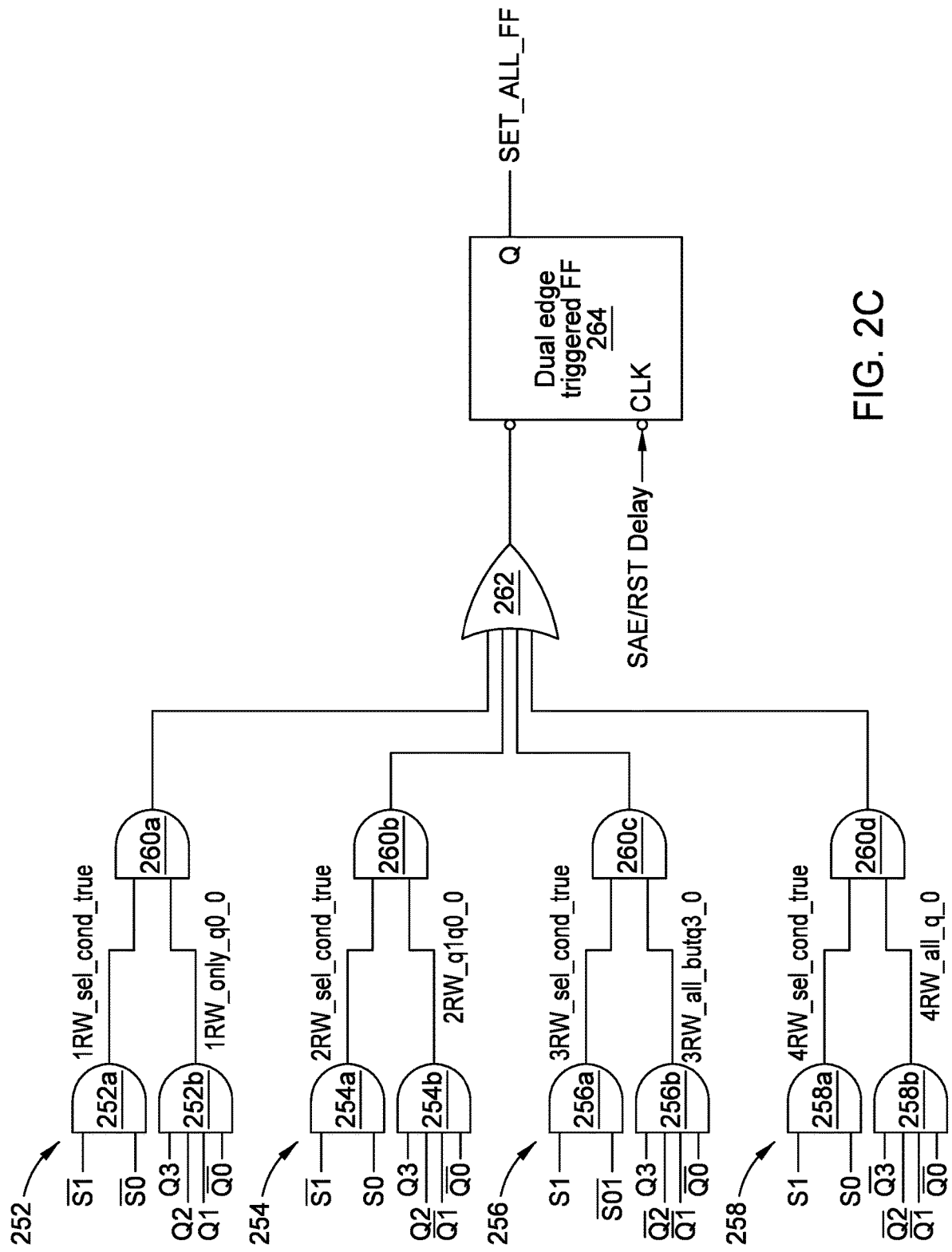
FIG. 2C is a schematic diagram of a set circuitry, according to an example.

FIG. 2C illustrates a set circuitry 250 according to examples. Set circuitry 250 generates SET_ALL_FF. Set circuitry 250 includes sets of logic circuitry 252-258. Each of the sets of logic circuitry 252-258 outputs a signal indicating the desired quantity of read/write operations in a cycle (e.g., a cycle of the clock signal Xclk), and whether the selected quantity of read/write operations has been met. The quantity of sets of logic circuitry 252-258 may be equal to the quantity of flip flops included in the driver circuitry 204. For example, because driver circuitry 204 includes four flip flops, the set circuitry 250 may include four sets of logic circuitry 252-258.

Each of the sets of logic circuitry 252-258 includes at least one logic circuit element. In the example shown in FIG. 2C, each set of logic circuitry 252-258 includes a select logic circuitry, a driver logic circuitry, and a completed logic circuitry. Each set of logic circuitry 252-258 may be implemented using different quantities of logic circuitry.

The select logic circuitry (252a, 254a, 256a, 258a) outputs a signal indicating that the selected quantity of read/write operations. The driver logic circuitry (252b, 254b, 256b, 258b) outputs a signal indicating how many read/write operations have been performed. The completed logic circuitry (260a, 260b, 260c, and 260d) may output a signal confirming that the desired quantity of read/write operations equals the selected number of read/write operations. Each set of logic circuitry 252-258 is configured to evaluate a specific quantity of read/write operation(s). In one example, as illustrated in FIG. 2C, each set of logic circuitries is implemented using AND logic gates. In other examples, other types of logic circuitries are used to implement the sets of logic circuitries 252-258.

The output of each set of logic circuitries is provided to a set logic circuitry 262 that outputs a signal (SET) indicating that the selected number of read/write operations have been completed. In one example, as illustrated in FIG. 2C, set logic circuitry 262 is implemented using an OR logic gate. In other examples, other types of logic circuitries may be used.

A first set of logic circuitry 252 includes select logic circuitry 252a, driver logic circuitry 252b, and a completed logic circuitry 260a. A second set of logic circuitry 254 includes select logic circuitry 254a, driver logic circuitry 254b, and completed logic circuitry 260b. A third set of logic circuitry 256 includes select logic circuitry 256a, driver logic circuitry 256b, and completed logic circuitry 260c. A fourth set of logic circuitry 258 includes select logic circuitry 258a, driver logic circuitry 258b, and completed logic circuitry 260d. The outputs of each completed logic circuitry 260a-260d may be provided to set logic circuitry 262.

Select logic circuitries 252a-258d are implemented as m×1 AND logic gates such as 2×1 AND logic gates. In other examples, other types of logic circuitries may be used to implement the select logic circuitries 252a-258d. Select logic circuitry 252a receive inverted S0 and inverted S1 as inputs and generate an output signal 1RW_sel_cond_true indicative of whether one read/write operation is to be performed. Select logic circuitry 254a receives S0 and inverted S1 as inputs and generates an output signal 2RW_sel_cond_true indicative of whether two read/write operations are to be performed. Select logic circuitry 256a receives inverted S0 and S1 as inputs and generate an output signal 3RW_sel_cond_true indicative of whether three read/write operations are to be performed. Select logic circuitry 258a receives S0 and S1 as inputs and generates an output signal 4RW_sel_cond_true indicative of whether four read/write operations are to be performed.

Driver logic circuitries 252b-258b are implemented as m×1 AND gates such as 4×1 AND gates. The number of inputs to driver logic circuitries 252b-258b may be equal to the number of flip flops included in driver circuitry 204. In other examples, other types of logic circuitries may be used to implement the driver logic circuitries 252b-258b. Driver logic circuitry 252b receives inverted Q0, 01, 02, and 03 as inputs and generate an output signal 1RW_only-q0_0 indicative of whether one read/write operation has been performed. Driver logic circuitry 254b receives inverted Q0, inverted Q1, Q2, and Q3 as inputs and generate an output signal 2RW_only-q0q1_0 indicative of whether two read/write operations have been performed. Driver logic circuitry 256b receives inverted Q0, inverted Q1, inverted Q2, and 03 as inputs and generate an output signal 3RW_only-q0q1q2_0 indicative of whether three read/write operations have been performed. Driver logic circuitry 258b receives inverted Q0, inverted Q1, inverted Q2, and inverted Q3 as inputs and generates an output signal 4RW_only-q0q1q2q3_0 indicative of whether four read/write operations have been performed.

Completed logic circuitries 260a-260d are implemented as m×1 AND logic gates such as 2×1 AND gates. In other examples, other types of logic circuitries may be used to implement the completed logic circuitries 260a-260d. Completed logic circuitry 260a receives 1RW_sel_cond_true and 1RW_only-q0_0 as inputs. Completed logic circuitry 260b receives 2RW_sel_cond_true and 2RW_only-q0q1_0 as inputs. Completed logic circuitry 260c receives 3RW_sel_cond_true and 3RW_only-q0q1q2_0 as inputs. Completed logic circuitry 260d receives 4RW_sel_cond_true and 4RW_only-q0q1q2q3_0 as inputs. As described above each completed logic circuitry 260a-260d provides an output to set logic circuitry 262. Each completed logic circuitry 260a-260d is indicative of whether the quantity of read/write operations to be performed and the quantity of read/write operations performed are equal.

As described above, SET indicates when the number of read/write outputs to be performed matches the number of read/write outputs performed. SET may be provided to a dual edge flip flop 264. The dual edge flip flop 264 receives SET at a data input and inverted SAE/RST_delay at a clock input. Therefore, at the conclusion of each iclk pulse, the dual edge flip flop 264 may match the output of SET_ALL_FF to SET. Stated differently when SET indicates the desired number of read/write operations have been performed, a SET_ALL_FF pulse may be generated, resetting flip flops 205a-205d at the conclusion of an iclk pulse.

In one example, if two read/write operations are to be performed, clock generation circuitry 122 is configured to output two iclk pulses to the self-time path circuitry 120 during one cycle of the clock signal Xclk. As described above, when two read/write operations are to be performed during one cycle of the clock signal Xclk, S0 may be set to logic level low and S1 may be set to logic level high.

In an example, when two read/write operations are to be performed, select logic circuitry 252a outputs 1RW_sel_cond_true as logic level low. Select logic circuitry 254a outputs 2RW_sel_cond_true as logic level high. Select logic circuitry 256a outputs 3RW_sel_cond_true as logic level low. Select logic circuitry 256a outputs 4RW_sel_cond_true as logic level low.

Prior to any of the iclk pulses, as described above, Q0-03 are all set to logic level high. Therefore, the outputs of driver logic circuitries 252a-258b are set to logic level low, causing the outputs of complete logic circuitries 260a-260d to be at logic level low.

At a first iclk pulse, Q0 becomes logic level low while Q1-Q3 remain at logic level high. Therefore, 1RW_only_q0_0 becomes logic level high, while the other completed logic circuitry outputs remain logic level low. However because 1RW_sel_cond_true is logic level low, SET remains at logic level low, and SET_ALL_FF in unaffected. Accordingly, a second iclk pulse may occur.

At the second iclk pulse, Q1 becomes logic level low while Q2-Q3 remain at logic level high. Therefore, 1RW_only_q0_0 switches to logic level low and 2RW_only_0q1_0 switches to logic level high. Here, 2RW_sel_cond_true is logic level high, and 2RW_only_q0q1_0 is logic level high, indicating that the quantity of read/write operations to be performed is equal to the number of read/write operations performed. Therefore, completed logic circuitry 260b outputs a logic level high, forcing SET to transition to a logic level high. This is turn, indicates that the selected number of read/write operations have been performed and causes SET_ALL_FF to pulse and reset flip flops 205a-206d for a subsequent cycle of read/write operations.

Although FIG. 2C was described using two read/write operations as an example, the process described above may be applied to any quantity of read/write operations.

In one or more examples, the operation of set circuitry 250 may use a logic level low where logic level high is described, and a logic level high where a logic level low is described.

Figure 3:
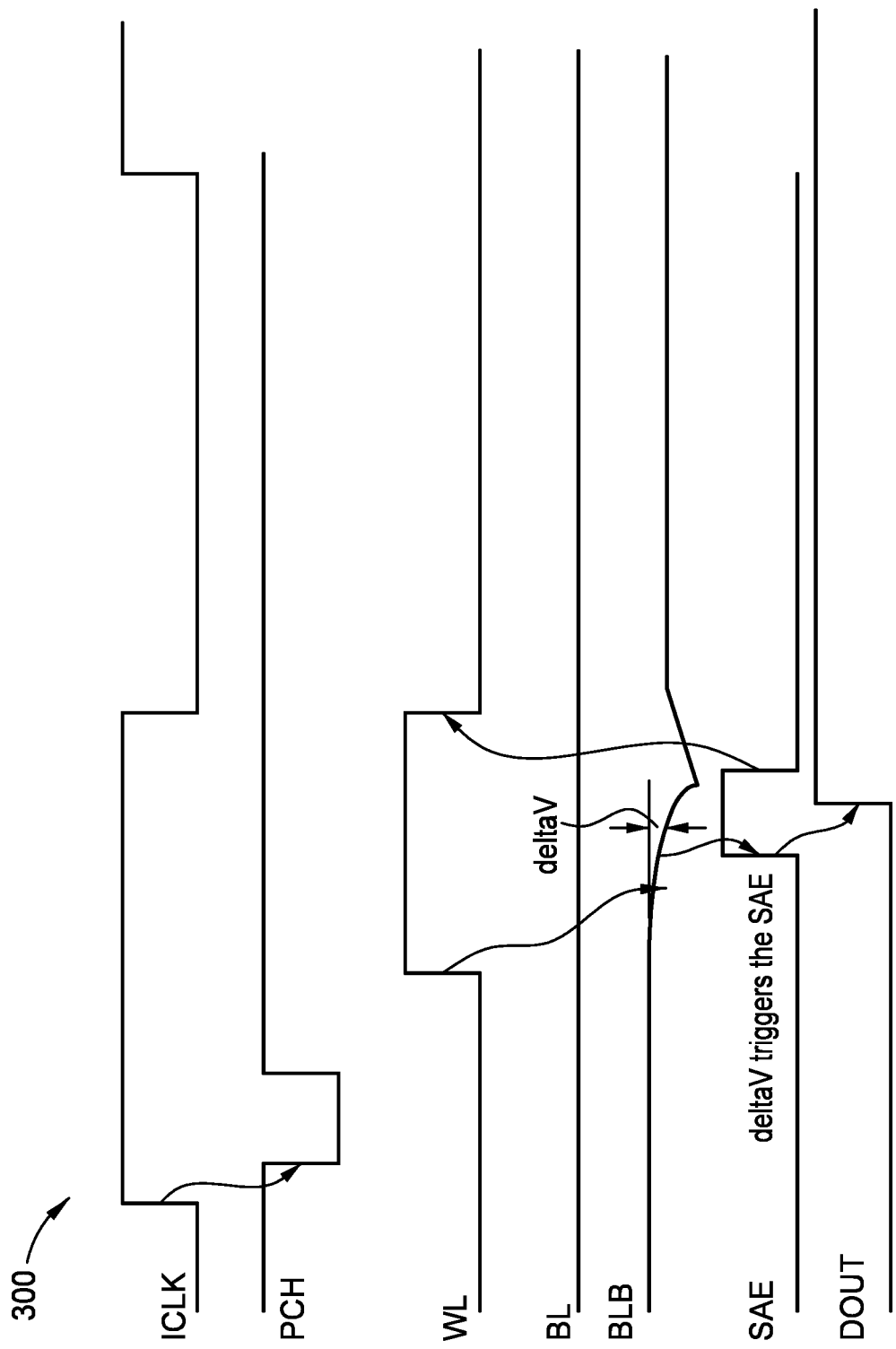
FIG. 3 is a timing diagram of the memory circuitry, according to an example.

FIG. 3 illustrates a timing diagram illustrating a single read operation of memory device circuitry 100. Example timing diagram 300 may be performed during each iclk cycle per cycle of read/write operations.

FIG. 3 illustrates an example of reading a binary one (logic level high) voltage from a memory cell 102. As illustrated in FIG. 3, during an iclk cycle (or pulse), a rising edge of an iclk pulse triggers a precharge signal pulse defined as PCH. The PCH pulse causes a set of bit lines 108 to be charged to a same voltage via pre-charge circuitry of the memory circuitry device 100 (not shown). In timing diagram 300, the voltage signal of a bit line 108a is defined as BL and the voltage signal of an inverse bit line 108b is defined as BLB. After the set of bit lines 108 are precharged, based on the address input, the row decoder circuitry 110 activates the corresponding word line 106, as indicated by a voltage signal WL switching to logic level high. The corresponding word line 106 being driven to logic level high causes the voltage of inverse bit line 108b (BLB) to discharge exponentially. Therefore, after WL is switched to logic level high BLB decreases exponentially. The difference in voltages between BL and BLB is defined as deltaV.

When deltaV reaches a threshold value, the sense driver circuitry 116 is triggered to generate an internal signal defined as SAE. SAE causes the sense driver circuitry 116 to read the voltage stored on the memory cell 102. Based on the read voltage, the sense driver circuitry 116 outputs a voltage Dout as indicative of the voltage stored on the memory cell 102. Therefore, in this example, the sense driver circuitry outputs Dout at logic level high because the voltage stored in the memory cell in a one (logic level high).

This process may be repeated for each pulse of iclk. As understood by the reader, the same logic may be applied to a write operation.

Figure 4:
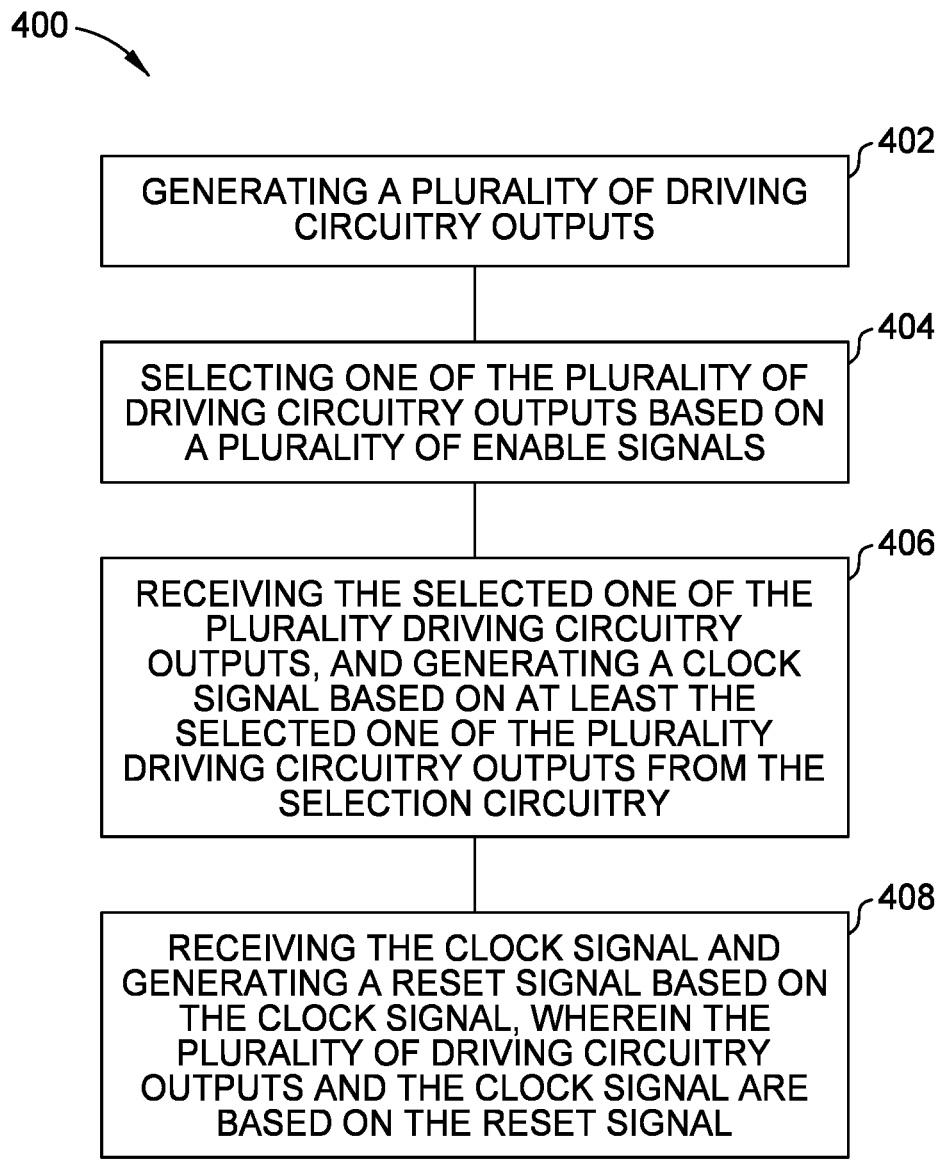
FIG. 4 illustrates a flow chart of a method for performing multiple read/write operations in a single clock cycle, according to an example.

In one or more examples, the read/write operations may use a logic level low where logic level high is described, and a logic level high where a logic level low is described FIG. 4 illustrates a flow chart of a method 400 for performing multiple read/write cycles during a clock cycle (e.g., cycle of the clock signal Xclk), according to an example.

FIG. 4 is described with reference to FIG. 1-FIG. 2C. At block 402 a driver circuitry 204 generates a plurality of driving outputs. For example the driver circuitry 204 includes a plurality of flip flops. In one example, as illustrated in FIG. 2A the driver circuitry includes four flips flops and the plurality of driving outputs are Q0-Q3. Each of the plurality of driving outputs are provided to a selection circuitry 206.

At block 404 the selection circuitry 206 selects one of the plurality of driver circuitry outputs based on a plurality of enable signals. For example, enable signals en-A-en-D are provided to decoder logic circuitry 202. Based on the enable signals en A-en-D, the decoder logic circuitry 202 generates selection signals and provides them to the selection circuitry 206. For example, the decoder logic circuitry 202 outputs selection signals S0 and S1 to the selection circuitry 206 and the selection circuitry 206 selects one of Q0-Q3 based on S0 and S1.

At block 406, clock generation circuitry 118 receives the selected one of the plurality of driving outputs selected by the selection circuitry 206. Based on the selected one of the plurality of driving outputs the clock generation circuitry 118 generates a clock signal. For example, the clock generation circuitry 118 generates iclk in the same manner discussed with respect to FIG. 2B.

At block 408, self-timing path circuitry 120 receives the clock signal and generates a reset signal based on the clock signal. For example, the self-timing path circuitry 120 generates SAE/RST based on each pulse of iclk. The plurality of driving outputs and the clock signal are based on the reset signal. For example, an inverted SAE/RST is provided to a clock input of flip flops 205a-205d and SAE/RST is also provided to SR flip flop 211. Thus, Q0-Q3, and iclk are based on SAE/RST. Furthermore, SAE/RST is provided to sense driver circuitry 116 and causes the memory device circuitry 100 to perform a read/write operation for each generated pulse of iclk. In one example, the SAE/RST resets and/or enables the source driver circuitry 116 to perform a read/write operation. In one example, the source driver circuitry 116 is reset based on each pulse of the SAE/RST and enabled to perform a subsequent read/write operation. As the SAE/RST may pulse multiple times during a cycle of the clock signal Xclk, the source driver circuitry 116 is able to perform multiple read/write operations with the memory bank 101 during a single cycle of the clock signal Xclk. Accordingly, in an example where the memory bank 101 is a single port memory bank, the single port memory bank supports multiple read/write operations during a single cycle of the clock signal Xclk.

While the foregoing is directed to specific examples, other and further examples may be devised without departing from the basic scope thereof, and the scope thereof is determined by the claims that follow.

What is claimed is:

1. An integrated circuitry device comprising:
   a driver circuitry configured to generate a plurality of driver circuitry outputs;
   a selection circuitry configured to select one of the plurality of driver circuitry outputs based on a plurality of enable signals;
   a clock generation circuitry configured to receive the selected one of the plurality of driver circuitry outputs from the selection circuitry, and generate a clock signal based on at least the selected one of the plurality of driver circuitry outputs from the selection circuitry; and
   a self-time path circuitry of a memory configured to receive the clock signal and generate a reset signal based on the clock signal, wherein the plurality of driver circuitry outputs and the clock signal are based on the reset signal, and wherein the self-time path circuitry corresponds to one or more columns of a memory bank.

2. The integrated circuitry device of claim 1, wherein the driver circuitry comprises a plurality of flip-flops each configured to output a data signal to the selection circuitry.

3. The integrated circuitry device of claim 1, wherein the selection circuitry comprises a multiplexer.

4. The integrated circuitry device of claim 1, wherein the reset signal is output to a sense driver circuitry, and wherein the sense driver circuitry is configured to perform at least one memory operation selected from the group consisting of reading data from the memory bank and writing data to the memory bank based on the reset signal.

5. The integrated circuitry device of claim 1, wherein the clock generation circuitry comprises:
   trigger circuitry configured to output a trigger signal to a first input of a logic gate circuitry based on the selected one of the plurality of driver circuitry outputs and an external clock signal; and
   a set-reset (SR) circuitry configured to provide an SR output to a second input of the logic gate circuitry, wherein the logic gate circuitry is further configured to receive the selected one of the plurality of driver circuitry outputs at a third input and generate the clock signal based on the trigger signal, the SR output, and the selected one of the plurality of driver circuitry outputs.

6. The integrated circuitry device of claim 1, wherein the selection circuitry is configured to receive at least one enable signal from decoder circuitry, the enable signal corresponding to a plurality of read operations and write operations.

7. The integrated circuitry device of claim 6, wherein the driver circuitry is configured to receive a set output generated by a set circuitry and generate the plurality of driver circuitry outputs based on the set output.

8. The integrated circuitry device of claim 7, wherein the set circuitry is configured to generate the set output based on the at least one enable signal from the decoder circuitry and the plurality of driver circuitry outputs.

9. A memory circuitry device comprising:
   a block of memory comprising a memory bank coupled to a sense driver circuitry;
   a driver circuitry configured to generate a plurality of driver circuitry outputs;
   a selection circuitry configured to select one of the plurality of driver circuitry outputs based on a plurality of enable signals;
   a clock generation circuitry configured to receive the selected one of the plurality of driver circuitry outputs from the selection circuitry, and generate a clock signal based on at least the selected one of the plurality of driver circuitry outputs from the selection circuitry; and a self-time path circuitry of the memory configured to receive the clock signal and generate a reset signal based on the clock signal, wherein the plurality of driver circuitry outputs and the clock signal are based on the reset signal, and wherein the self-time path circuitry corresponds to one or more columns of the memory bank.

10. The memory circuitry device of claim 9, wherein the driver circuitry comprises a plurality of flip-flops each configured to output a data signal to the selection circuitry.

11. The memory circuitry device of claim 9, wherein the reset signal is output to the sense driver circuitry, and wherein the sense driver circuitry is configured to perform at least one memory operation selected from the group consisting of reading data from the memory bank and writing data to the memory bank based on the reset signal.

12. The memory circuitry device of claim 9, wherein the clock generation circuitry comprises:
   trigger circuitry configured to output a trigger signal to a first input of a logic gate circuitry based on the selected one of the plurality of driver circuitry outputs and an external clock signal; and
   a set-reset (SR) circuitry configured to provide an SR output to a second input of the logic gate circuitry, wherein the logic gate circuitry is further configured to receive the selected one of the plurality of driver circuitry outputs at a third input and generate the clock signal based on the trigger signal, the SR output, and the selected one of the plurality of driver circuitry outputs.

13. The memory circuitry device of claim 9, wherein the selection circuitry is configured to receive at least one enable signal from decoder circuitry, the enable signal corresponding to a plurality of read operations and write operations.

14. The memory circuitry device of claim 13, wherein the driver circuitry is configured to receive a set output generated by a set circuitry and generate the plurality of driver circuitry outputs based on the set output.

15. The memory circuitry device of claim 14, wherein the set circuitry is configured to generate the set output based on the at least one enable signal from the decoder circuitry and the plurality of driver circuitry outputs.

16. A method comprising:
   generating, by a driver circuitry, a plurality of driver circuitry outputs;
   selecting, by a selection circuitry, one of the plurality of driver circuitry outputs based on a plurality of enable signals;
   receiving, by a clock generation circuitry, the selected one of the plurality of driver circuitry outputs from the selection circuitry, and generating, by the clock generation circuitry, a clock signal based on at least the selected one of the plurality of driver circuitry outputs from the selection circuitry; and
   receiving, by a self-time path circuitry of a memory, the clock signal and generating a reset signal based on the clock signal, wherein the plurality of driver circuitry outputs and the clock signal are based on the reset signal, and wherein the self-time path circuitry corresponds to one or more columns of a memory bank.

17. The method of claim 16, wherein the reset signal is output to a sense driver circuitry, and wherein the sense driver circuitry performs at least one memory operation selected from the group consisting of reading data from the memory bank and writing data to the memory bank based on the reset signal.

18. The method of claim 16, wherein the selection circuitry comprises a multiplexer.

19. The method of claim 16, wherein the driver circuitry comprises a plurality of flip-flops that each output a data signal to the selection circuitry.

20. The method of claim 16, further comprising:
   generating a trigger signal, by trigger circuitry, and providing the trigger signal to a first input of a logic gate circuitry based on the selected one of the plurality of driver circuitry outputs and an external clock signal; and
   generating an SR output, by a set-reset (SR) circuitry, and providing the SR output to a second input of the logic gate circuitry, wherein the logic gate circuitry receives the selected one of the plurality of driver circuitry outputs at a third input and generates the clock signal based on the trigger signal, the SR output, and the selected one of the plurality of driver circuitry outputs.

* * * * *